(12) United States Patent
Furue et al.

(10) Patent No.: US 11,561,469 B2
(45) Date of Patent: Jan. 24, 2023

(54) PHOTOSENSITIVE RESIN COMPOSITION

(71) Applicant: SHOWA DENKO K.K., Tokyo (JP)

(72) Inventors: Kentaro Furue, Tokyo (JP); Yuki Miyaishi, Tokyo (JP); Shiyuko Nakamura, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 307 days.

(21) Appl. No.: 16/500,881

(22) PCT Filed: Apr. 6, 2018

(86) PCT No.: PCT/JP2018/014771
§ 371 (c)(1),
(2) Date: Oct. 4, 2019

(87) PCT Pub. No.: WO2018/186494
PCT Pub. Date: Oct. 11, 2018

(65) Prior Publication Data
US 2020/0033726 A1 Jan. 30, 2020

(30) Foreign Application Priority Data

Apr. 7, 2017 (JP) .............................. JP2017-076592

(51) Int. Cl.
| | |
|---|---|
| *G03F 7/023* | (2006.01) |
| *G03F 7/20* | (2006.01) |
| *G03F 7/032* | (2006.01) |
| *H05B 33/10* | (2006.01) |
| *H05B 33/22* | (2006.01) |

(52) U.S. Cl.
CPC .............. *G03F 7/023* (2013.01); *G03F 7/032* (2013.01); *G03F 7/2016* (2013.01); *H05B 33/10* (2013.01); *H05B 33/22* (2013.01)

(58) Field of Classification Search
CPC ........ G03F 7/022; G03F 7/105; G03F 7/0223; G03F 7/20; G03F 7/004; G03F 7/023; H05B 33/10; H05B 33/22; H01L 51/50
USPC .................................................. 430/189, 196
See application file for complete search history.

(56) References Cited

U.S. PATENT DOCUMENTS

| | | | |
|---|---|---|---|
| 5,407,779 A | 4/1995 | Uetani et al. | |
| 5,529,882 A | 6/1996 | Takezoe et al. | |
| 2010/0069520 A1* | 3/2010 | Kim .................. | C08G 73/1042 |
| | | | 522/36 |
| 2010/0099041 A1 | 4/2010 | Fujita et al. | |

(Continued)

FOREIGN PATENT DOCUMENTS

| | | |
|---|---|---|
| JP | 49-5432 A | 1/1974 |
| JP | 57-205322 A | 12/1982 |
| JP | 60-65069 A | 4/1985 |
| JP | 61-201610 A | 9/1986 |
| JP | 5-341530 A | 12/1993 |
| JP | H6-3818 A | 1/1994 |

(Continued)

OTHER PUBLICATIONS

International Search Report for PCT/JP2018/014771 dated Jun. 19, 2018.

*Primary Examiner* — Duane Smith
*Assistant Examiner* — Nicholas E Brown
(74) *Attorney, Agent, or Firm* — Sughrue Mion, PLLC

(57) ABSTRACT

A black positive-type photosensitive resin composition with high sensitivity is provided. The photosensitive resin composition of the invention includes (A) a binder resin, (B) a quinonediazide adduct of a phenol compound having 3 or more phenolic hydroxyl groups (hereunder also referred to as "trivalent or greater phenol compound", and (C) a black coloring agent, wherein the quinonediazide adduct (B) includes (b1) a quinonediazide adduct wherein one of the hydroxyl groups of the phenolic hydroxyl groups of the trivalent or greater phenol compound is replaced by a structure represented by formula (I) or formula (II), and (b2) a quinonediazide adduct wherein two of the hydroxyl groups of the phenolic hydroxyl groups of the trivalent or greater phenol compound are replaced by structures represented by formula (I) or formula (II), and the total of (b1) and (b2) is at least 60 mol % of the entirety of (B). $R^a$ to $R^d$ and * in the formulas are as defined in the Specification.

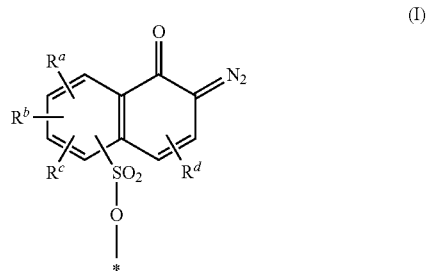

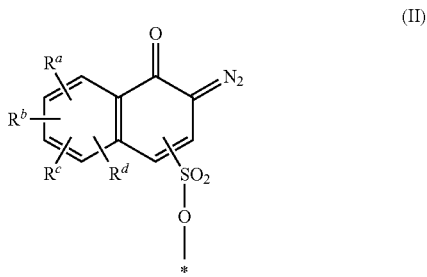

11 Claims, No Drawings

(56) References Cited

U.S. PATENT DOCUMENTS

| | | | |
|---|---|---|---|
| 2012/0287393 A1* | 11/2012 | Liu | G03F 7/0007 430/326 |
| 2013/0189623 A1 | 7/2013 | Kim et al. | |
| 2017/0299965 A1 | 10/2017 | Hashimoto et al. | |
| 2018/0253003 A1 | 9/2018 | Furue et al. | |
| 2019/0011834 A1* | 1/2019 | Tan | G03F 7/38 |

FOREIGN PATENT DOCUMENTS

| | | | | |
|---|---|---|---|---|
| JP | 6-167805 A | 6/1994 | | |
| JP | 6-230215 A | 8/1994 | | |
| JP | 7-278471 A | 10/1995 | | |
| JP | 8-137098 A | 5/1996 | | |
| JP | 9-34107 A | 2/1997 | | |
| JP | 2001-281440 A | 10/2001 | | |
| JP | 2001-343743 A | 12/2001 | | |
| JP | 2002-116536 A | 4/2002 | | |
| JP | 2002116536 A * | 4/2002 | G03F 7/0007 | |
| JP | 2003-119381 A | 4/2003 | | |
| JP | 2004-145320 A | 5/2004 | | |
| JP | 2004-326094 A | 11/2004 | | |
| JP | 2007-206562 A | 8/2007 | | |
| JP | 2008-185692 A | 8/2008 | | |
| JP | 2008-225457 A | 9/2008 | | |
| JP | 2010-237310 A | 10/2010 | | |
| JP | 2011-514985 A | 5/2011 | | |
| JP | 2013-533508 A | 8/2013 | | |
| JP | 2013-228685 A | 11/2013 | | |
| JP | 2015-145912 A | 8/2015 | | |
| JP | 2016-38431 A | 3/2016 | | |
| KR | 10-2016-0135334 A | 11/2016 | | |
| WO | 98/01791 A1 | 1/1998 | | |
| WO | 2009/110764 A2 | 9/2009 | | |
| WO | 2016/010124 A1 | 1/2016 | | |
| WO | 2016/056451 A1 | 4/2016 | | |
| WO | WO 2017/032437 * | 3/2017 | | |
| WO | WO-2017032437 A1 * | 3/2017 | G03F 7/0048 | |
| WO | 2017/069172 A1 | 4/2017 | | |

* cited by examiner

PHOTOSENSITIVE RESIN COMPOSITION

CROSS REFERENCE TO RELATED APPLICATIONS

This application is a National Stage of International Application No. PCT/JP2018/014771 filed Apr. 6, 2018, claiming priority based on Japanese Patent Application No. 2017-076592, filed Apr. 7, 2017.

FIELD

The present invention relates to a photosensitive resin composition. In particular, it relates to a high-sensitivity, black positive-type photosensitive resin composition, and to a barrier rib or insulating film for an organic EL display device using the same.

BACKGROUND

For improved display properties in display devices such as organic EL displays (OLED), it is common to use barrier rib materials at spacing members between colored patterns in the display area or the edge of the surrounding sections of the display area, for example. In production of an organic EL display device, first barrier ribs are formed to prevent mutual contact between the organic substance picture elements, and then the organic substance picture elements are formed between the barrier ribs. The barrier ribs are generally formed by photolithography using a photosensitive resin composition. More specifically, after a coating applicator has been used to coat a substrate with the photosensitive resin composition and the volatile components have been removed by heating or other means, exposure is carried out through a mask, and then a developing solution such as an aqueous alkali solution is used for development by removal of the unexposed sections, in the case of a negative-type, or the exposed sections, in the case of a positive-type, and the obtained pattern is heat treated to form the barrier ribs. An ink-jet method is then used to form films of organic substances that emit light of the three colors red, green and blue, between the barrier ribs, to form picture elements for the organic EL display device.

Recently in the field there has been a need for higher performance and higher definition of picture elements due to the increasingly smaller sizes of display devices and greater diversification of their contents. It has been attempted to provide barrier rib materials with a light-shielding property by the use of coloring agents, in order to increase contrast in display devices and improved visibility. Because low sensitivity lengthens the exposure time and reduces productivity, it is important for the material composing the barrier rib material to have high sensitivity.

PTL 1, for example, proposes a method for coloring barrier rib materials using a radiation-sensitive resin composition that includes a pigment.

PTL 2 proposes a radiation-sensitive resin composition having high resolution and exhibiting a light-shielding property by heat treatment after light exposure, the composition having a thermal dye added to a positive-type radiation-sensitive resin composition that includes an alkali-soluble resin and a quinonediazide compound. In this positive-type radiation-sensitive resin composition, the thermal dye is unreacted and in an uncolored state before light exposure, and therefore the resin composition itself has no light-shielding property and the radiation sensitivity is not impaired. It is therefore able to form high-definition patterns, while the thermal dye reacts by the heat treatment after light exposure to exhibit a light-shielding property.

CITATION LIST

Patent Literature

[PTL 1] Japanese Unexamined Patent Publication No. 2002-116536
[PTL 2] Japanese Unexamined Patent Publication No. 2010-237310

SUMMARY

Technical Problem

With the radiation-sensitive resin composition described in PTL 1, however, it is necessary to use a considerable amount of coloring agent in order to increase the light-shielding property of the cured film. When such large amounts of coloring agents are used, absorption of the exposed radiation by the coloring agent causes the effective intensity of radiation in the coating film to be lowered, creating the inconvenience of lower sensitivity during pattern formation.

With the radiation-sensitive resin composition described in PTL 2, the only mention of the light-shielding property is in regard to total light transmittance, while nothing is mentioned regarding the color hue. Although the thermal dye used provides a light-shielding property after heating, it is not black and has a major effect on the color hue for the peripheral members in an actual panel, which can potentially lead to reduced picture quality.

For example, during formation of a pattern in an organic EL display device, from the viewpoint of productivity it is important for the material forming the pattern to have high sensitivity. However, when a black photosensitive resin composition containing a black coloring agent or similar is used, it may result in poor light exposure under commonly used light exposure conditions, requiring a long exposure time, for example, and leading to lower productivity.

The present invention has been accomplished in light of these circumstances, and its object is to provide a black photosensitive resin composition, the photosensitive resin composition having high sensitivity allowing it to be used even under commonly used light exposure conditions, for example.

Solution to Problem

As a result of ardent research, the present inventors have found that in a black photosensitive resin composition that includes a quinonediazide adduct of a phenol compound having 3 or more phenolic hydroxyl groups (hereunder also referred to as "trivalent or greater phenol compound"), a binder resin and a black coloring agent, using a specific quinonediazide adduct results in high sensitivity even though it is a black photosensitive resin composition, and can improve pattern formability by photolithography employing common light exposure conditions, for example.

Specifically, the invention encompasses the following aspects.

[1] A photosensitive resin composition including:

(A) a binder resin, (B) a quinonediazide adduct of a phenol compound having 3 or more phenolic hydroxyl groups (hereunder also referred to as "trivalent or greater phenol compound", and (C) a black coloring agent, wherein:

the quinonediazide adduct (B) includes:

(b1) a quinonediazide adduct wherein one of the hydroxyl groups of the phenolic hydroxyl groups of the trivalent or greater phenol compound is replaced by a structure represented by formula (I) or (II), and (b2) a quinonediazide adduct wherein two of the hydroxyl groups of the phenolic hydroxyl groups of the trivalent or greater phenol compound are replaced by structures represented by formula (I) or (II), and the total of (b1) and (b2) is at least 60 mol % of the entirety of (B),

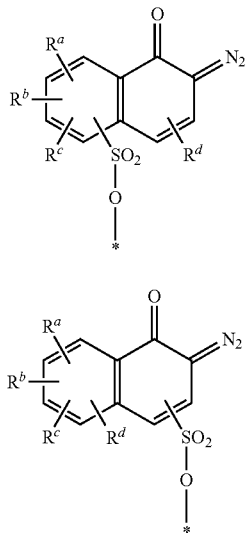

wherein $R^a$ to $R^d$ each independently represent a hydrogen atom, an alkyl group of 1 to 10 carbon atoms or an alkoxy group of 1 to 10 carbon atoms, and the * symbol represents a bond with the aromatic ring of a trivalent or greater phenol compound.

[2] The photosensitive resin composition according to [1] above, wherein the trivalent or greater phenol compound has 3 or more aromatic rings.

[3] The photosensitive resin composition according to [1] or [2] above, wherein the trivalent or greater phenol compound is at least one selected from among compounds represented by the following formulas (III) to (VI).

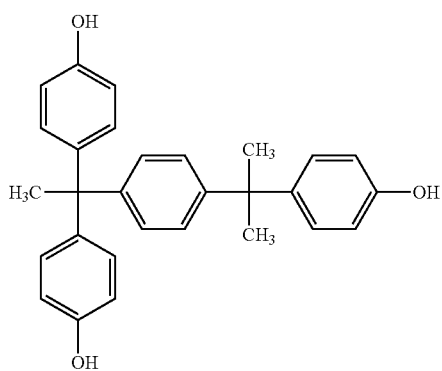

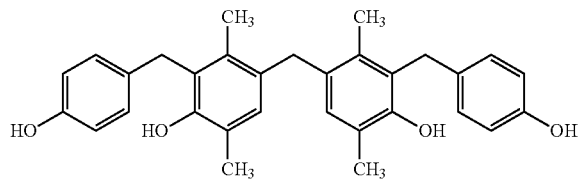

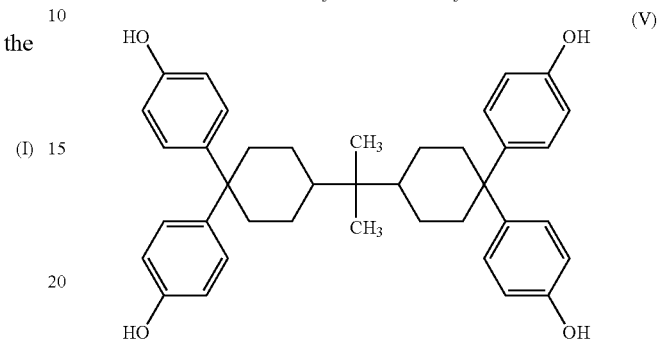

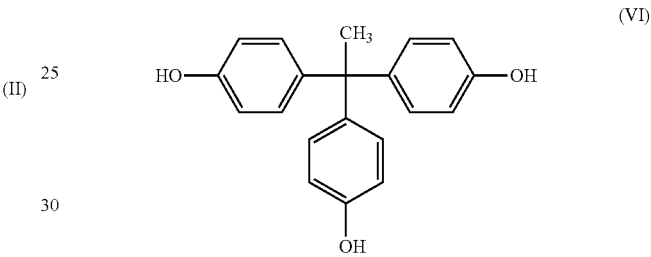

[4] The photosensitive resin composition according to any one of [1] to [3] above, wherein the content of the binder resin (A) is 100 to 1000 parts by mass and the content of the black coloring agent (C) is 15 to 750 parts by mass, with respect to 100 parts by mass as the total amount of the quinonediazide adduct (B).

[5] The photosensitive resin composition according to any one of [1] to [4], wherein the binder resin (A) contains at least one selected from the group consisting of (a1) alkali-soluble copolymers of a polymerizable monomer having an alkali-soluble functional group, and another polymerizable monomer, and (a2) alkali-soluble resins having an epoxy group and a phenolic hydroxyl group.

[6] The photosensitive resin composition according to any one of [1] to [5] above, wherein the black coloring agent (C) includes at least one selected from the group consisting of (c1) black dyes specified by a color index of solvent black 27 to 47, and (c2) titanium black.

[7] An organic EL element insulating film comprising a cured product of the photosensitive resin composition according to any one of [1] to [6] above.

[8] An organic EL element barrier rib comprising a cured product of the photosensitive resin composition according to any one of [1] to [6] above.

[9] An organic EL element that includes a cured product of the photosensitive resin composition according to any one of [1] to [6] above.

[10] A method for producing a radiation lithography structure, the method including:

(1) a coating step in which a photosensitive resin composition according to any one of [1] to [6] above is dissolved in a solvent and coated onto a substrate, (2) a drying step in which the solvent in the coated photosensitive resin composition is removed, (3) an exposure step in which radiation is irradiated through a photomask, (4) a developing step in which a pattern is formed by alkali development, and (5) a heat treatment step in which heating is carried out at a temperature of 100 to 350° C.

Advantageous Effects of Invention

According to the invention it is possible to provide a high-sensitivity photosensitive resin composition that is able to retain black color and maintain a high light-shielding property.

DESCRIPTION OF EMBODIMENTS

The invention will now be explained in greater detail.
(A) Binder Resin

The binder resin (A) to be used in the photosensitive resin composition of the invention is not particularly restricted, but preferably it has an alkali-soluble functional group and is alkali-soluble. The alkali-soluble functional group of the binder resin is not particularly restricted and may be a carboxyl group, alcoholic hydroxyl group, phenolic hydroxyl group, sulfo group, phosphate group or acid anhydride group, and the resin used may also comprise a combination of two or more alkali-soluble functional groups. Examples of binder resins include acrylic resins, styrene resins, epoxy resins, amide resins, phenol resins and polyamic acid resins. These resins may be used alone or in combinations of two or more.

An alkali-soluble resin used may be an alkali-soluble copolymer (a1) of a polymerizable monomer with an alkali-soluble group mentioned below and another polymerizable monomer, an alkali-soluble resin (a2) with an epoxy group and a phenolic hydroxyl group ("component (a2)") or another alkali-soluble resin (a3) ("component (a3)"). For the purpose of the invention, "alkali-soluble" means the ability to dissolve in an alkali solution, such as a 2.38 mass % aqueous tetramethylammonium hydroxide solution.
(a1) Alkali-Soluble Copolymer of Polymerizable Monomer with Alkali-Soluble Group and Another Polymerizable Monomer The binder resin (A) of the invention preferably includes an alkali-soluble copolymer (a1) of a polymerizable monomer with an alkali-soluble group and another polymerizable monomer. The alkali-soluble group of the copolymer (a1) may be a carboxyl group, alcoholic hydroxyl group, phenolic hydroxyl group, sulfo group, phosphate group, acid anhydride group, or the like. The copolymer of a polymerizable monomer with an alkali-soluble group and another polymerizable monomer can be produced by radical polymerization of the polymerizable monomer with an alkali-soluble group and another polymerizable monomer, with a polymerization initiator and a RAFT (Reversible Addition Fragmentation Transfer) agent, for example. Alternatively, it may be one obtained by synthesizing a copolymer by radical polymerization and then adding an alkali-soluble group. The polymerizable functional group of the polymerizable monomer may be a radical-polymerizing functional group. Specific examples include $CH_2=CH-$, $CH_2=C(CH_3)-$, $CH_2=CHCO-$, $CH_2=C(CH_3)CO-$, $-OC-CH=CH-CO-$, etc. Examples of polymerizable monomers with alkali-soluble groups include 4-hydroxystyrene, (meth) acrylic acid, α-bromo(meth)acrylic acid, α-chlor(meth) acrylic acid, β-furyl(meth)acrylic acid, β-styryl(meth) acrylic acid, maleic acid, monomethyl malate, monoethyl malate, monoisopropyl malate, fumaric acid, cinnamic acid, α-cyanocinnamic acid, itaconic acid, crotonic acid, propiolic acid, 4-hydroxyphenyl methacrylate, 3,5-dimethyl-4-hydroxybenzylacrylamide, 4-hydroxyphenylacrylamide, 4-hydroxyphenylmaleimide, 3-maleimidepropionic acid, 4-maleimidebutyric acid and 6-maleimidehexanoic acid.

Examples of other polymerizable monomers include styrene, polymerizable styrene derivatives such as vinyltoluene, α-methylstyrene, p-methylstyrene and p-ethylstyrene, acrylamide, acrylonitrile, vinyl alcohol ethers such as vinyl-n-butyl ether, (meth)acrylic acid esters such as alkyl (meth) acrylate ester, tetrahydrofurfuryl (meth)acrylate ester, dimethylaminoethyl (meth)acrylate ester, diethylaminoethyl (meth)acrylate ester and glycidyl (meth)acrylate ester, 2,2,2-trifluoroethyl (meth)acrylate, 2,2,3,3-tetrafluoropropyl (meth)acrylate, isobornyl (meth)acrylate, maleic anhydride, and N-substituted maleimides such as phenylmaleimide and cyclohexylmaleimide. The term "(meth)acrylic" used here means "acrylic" and "methacrylic". From the viewpoint of heat resistance, component (a1) preferably has one or more ring structures such as an alicyclic structure, aromatic structure, polycyclic structure, inorganic ring structure or heterocyclic structure.

The polymerizable monomer with an alkali-soluble group is preferably one that can form a monomer unit represented by the following formula,

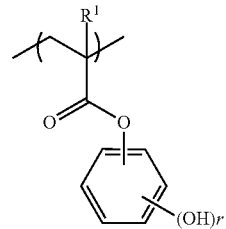

wherein $R^1$ represents a hydrogen atom or an alkyl group of 1 to 5 carbon atoms, and r represents an integer of 1 to 5. The polymerizable monomer with an alkali-soluble group that can form such a monomer unit is most preferably 4-hydroxyphenyl methacrylate.

The other polymerizable monomer is preferably one that can form a monomer unit represented by the following formula,

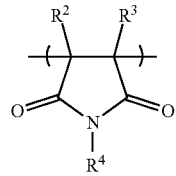

wherein $R^2$ and $R^3$ each independently represent a hydrogen atom, an alkyl group of 1 to 3 carbon atoms, a totally or partially fluorinated alkyl group of 1 to 3 carbon atoms or a halogen atom, $R^4$ represents a hydrogen atom, a straight-chain or cyclic alkyl group of 1 to 6 carbon atoms, a phenyl group, or a phenyl group substituted with at least one selected from the group consisting of hydroxyl group, alkyl groups of 1 to 6 carbon atoms and alkoxy groups of 1 to 6 carbon atoms. The other polymerizable monomer that can form such a monomer unit is most preferably phenylmaleimide or cyclohexylmaleimide.

The polymerization initiator to be used in production by radical polymerization of the alkali-soluble copolymer of the polymerizable monomer with an alkali-soluble group and another polymerizable monomer may be, but is not restricted to, any of the following: azo polymerization initiators such as 2,2'-azobisisobutyronitrile, 2,2'-azobis(2-methylbutyronitrile), dimethyl 2,2'-azobis(2-methyl propionate), 4,4'-azobis(4-cyanovaleric acid) and 2,2'-azobis(2,4-dimethylvaleronitrile) (AVN), peroxide polymerization initiators with 10-hour half-life temperatures of 100 to 170° C., such as dicumyl peroxide, 2,5-dimethyl-2,5-di(tert-butylperoxy)hexane, tert-butylcumyl peroxide, di-tert-butyl peroxide, 1,1,3,3-tetramethylbutyl hydroperoxide and cumene hydroperoxide, and peroxide polymerization initiators such as benzoyl peroxide, lauroyl peroxide, 1,1'-di(t-butylperoxy)cyclohexane and t-butyl peroxypivalate. The amount of polymerization initiator used is generally preferred to be 0.01 part by mass or greater, 0.05 part by mass or greater or 0.5 part by mass or greater, and no greater than 40 parts by mass, no greater than 20 parts by mass or no greater than 15 parts by mass, with respect to 100 parts by mass of the mixture of the polymerizable monomers.

The RAFT agent used may be, but is not limited to, any from among thiocarbonylthio compounds such as dithioesters, dithiocarbamates, trithiocarbonates and xanthates. The RAFT agent is preferably used in a range of 0.005 to 20 parts by mass or a range of 0.01 to 10 parts by mass, with respect to 100 parts by mass as the total amount of the polymerizable monomers.

The weight-average molecular weight (Mw) of the alkali-soluble copolymer (a1) of the polymerizable monomer with an alkali-soluble group and another polymerizable monomer is 5,000 to 80,000, preferably 6,000 to 70,000 and more preferably 7,000 to 60,000. The number-average molecular weight (Mn) is in the range of 1000 to 30,000, preferably in the range of 3000 to 25,000 and more preferably in the range of 5,000 to 20,000. The polydispersity (Mw/Mn) is 1.0 to 3.0, preferably 1.1 to 2.8 and more preferably 1.2 to 2.5. If the weight-average molecular weight, number-average molecular weight and polydispersity are within these ranges the alkaline solubility and developability will be excellent.

By using a polymer obtained by radical polymerization of these polymerizable monomers it is also possible to improve the shape retention and developability while also helping to reduce outgas.

There are no particular restrictions on the reaction temperature and reaction time for production of the alkali-soluble copolymer (a1) of the polymerizable monomer with an alkali-soluble group and another polymerizable monomer, but the polymerization temperature is preferably 50 to 150° C., more preferably 60 to 130° C. and even more preferably 70 to 120° C. The polymerization time is preferably 2 to 24 hours, more preferably 3 to 12 hours and even more preferably 4 to 8 hours.

The binder resin (A) of the invention may also include, in addition to the component (a1) mentioned above, the following components: (a2) an alkali-soluble resin with an epoxy group and a phenolic hydroxyl group (component (a2)) and (a3) another alkali-soluble resin (component (a3)).
(a2) Alkali-Soluble Resin with Epoxy Group and Phenolic Hydroxyl Group The binder resin (A) of the invention may be an alkali-soluble resin with an epoxy group and a phenolic hydroxyl group. The alkali-soluble resin may be obtained, for example, by reacting an epoxy group of a compound having at least two epoxy groups in the molecule (hereunder also referred to as "epoxy compound") with the carboxyl group of a hydroxybenzoic acid. If the alkali-soluble resin (a2) in the photosensitive resin composition of the invention has an epoxy group, crosslinking reaction will take place with the phenolic hydroxyl group during heating, providing an advantage of increased chemical resistance and heat resistance, and if it has a phenolic hydroxyl group, the advantage of solubility in aqueous alkali solutions will be provided.

The following reaction formula 1 is an example of a reaction in which one epoxy group of an epoxy compound reacts with the carboxyl group of hydroxybenzoic acid to form a compound with a phenolic hydroxyl group.

Reaction Formula 1

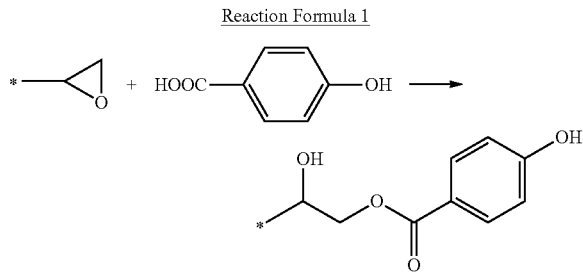

Examples of compounds with at least two epoxy groups in the molecule include phenol-novolak-type epoxy resins, cresol-novolak-type epoxy resins, bisphenol-type epoxy resins, biphenol-type epoxy resins, naphthalene backbone-containing epoxy resins and heterocyclic epoxy resins. These epoxy compounds need only have two or more epoxy groups per molecule, and a single type or a combination of two or more types may be used. Because these compounds are thermosetting, they cannot be uniquely specified due to differences such as the presence or absence of epoxy groups, the types of functional groups and the degree of polymerization, as is commonly known by those skilled in the art. Examples of novolak-type epoxy resin structures are shown in structural formula (1). $R^5$ in formula (1) represents a hydrogen atom or an alkyl group of 1 to 4 carbon atoms, and q represents an integer of 0 to 50.

(1)

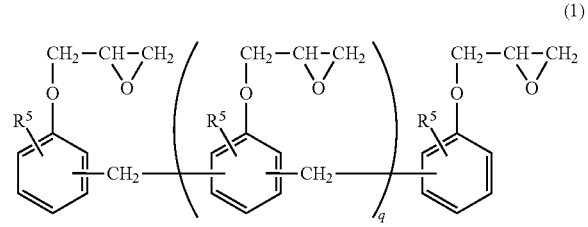

Examples of phenol-novolak-type epoxy resins include EPICLON® N-770 (product of DIC Corp.) and jER®-152 (product of Mitsubishi Chemical Corp.).

Examples of cresol-novolak-type epoxy resins include EPICLON® N-695 (product of DIC Corp.) and EOCN®-102S (product of Nippon Kayaku Co., Ltd.).

Examples of bisphenol-type epoxy resins include the bisphenol A-type epoxy resins such as jER® 828 and jER® 1001 (products of Mitsubishi Chemical Corp.) and YD-128 (trade name of Nippon Steel & Sumikin Chemical Co.), and the bisphenol F-type epoxy resins such as jER® 806 (product of Mitsubishi Chemical Corp.) and YDF-170 (trade name of Nippon Steel & Sumikin Chemical Co.).

Examples of biphenol-type epoxy resins include jER® YX-4000 and jER® YL-6121H (products of Mitsubishi Chemical Corp.).

Examples of naphthalene backbone-containing epoxy resins include NC-7000 (trade name of Nippon Kayaku Co., Ltd.) and EXA-4750 (trade name of DIC Corp.).

An example of an alicyclic epoxy resin is EHPE®-3150 (product of Daicel Chemical Industries, Ltd.).

Examples of heterocyclic epoxy resins include TEPIC®, TEPIC-L, TEPIC-H and TEPIC-S (products of Nissan Chemical Industries, Ltd.).

A "hydroxybenzoic acid" is a compound that is benzoic acid with at least one of positions 2 to 6 substituted with a hydroxyl group, examples thereof including salicylic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-hydroxy-5-nitrobenzoic acid, 3-hydroxy-4-nitrobenzoic acid and 4-hydroxy-3-nitrobenzoic acid, among which dihydroxybenzoic acid is preferred from the viewpoint of increasing the alkali developing property. A single type of hydroxybenzoic acid may be used, or a combination of two or more different types may be used.

The method for obtaining an alkali-soluble compound with a phenol group from the epoxy compound and a hydroxybenzoic acid uses preferably 0.20 to 0.90 equivalent, more preferably 0.25 to 0.85 equivalent and even more preferably 0.30 to 0.80 equivalent of the hydroxybenzoic acid with respect to 1 equivalent of epoxy groups of the epoxy compound. If the hydroxybenzoic acid is present at 0.2 equivalent or greater then adequate alkaline solubility will be exhibited, and if it is present at no greater than 0.9 equivalent it will be possible to inhibit molecular weight increase due to secondary reactions.

A catalyst may be used to accelerate the reaction. The amount of catalyst used is preferably 0.1 to 10 parts by mass with respect to 100 parts by mass of the mixture of reaction starting materials comprising the epoxy compound and the hydroxybenzoic acid. The reaction temperature is preferably 60 to 150° C. and the reaction time is preferably 3 to 30 hours. Examples of catalysts to be used in the reaction include triethylamine, benzyldimethylamine, triethylammonium chloride, benzyltrimethylammonium bromide, benzyltrimethylammonium iodide, triphenylphosphine, chromium octanoate and zirconium octanoate.

The number-average molecular weight of the alkali-soluble resin (a2) with an epoxy group and a phenolic hydroxyl group is preferably in the range of 500 to 8000, more preferably in the range of 1000 to 6000 and even more preferably in the range of 1500 to 4000. If the molecular weight is 500 or greater the solubility in the aqueous alkali solution will be suitable, making it satisfactory as a photosensitive material resin, and if the molecular weight is no greater than 8000 the coatability and developability will be satisfactory.

(a3) Other Alkali-Soluble Resin

Examples for the other alkali-soluble resin (a3) include publicly known phenol resins such as phenol-novolak resins, cresol-novolak resins, triphenylmethane-type phenol resins, phenol-aralkyl resins, biphenylaralkyl-phenol resins and phenol-dicyclopentadiene copolymer resins. A polyalkenylphenol resin obtained by alkenyl etherification of the hydroxyl groups and further Claisen rearrangement of the alkenyl ether groups, may be used as the binder resin (A).

Examples of other alkali-soluble resins include hydroxypolystyrene resin derivatives having the structure represented by structural formula (2). By including such a resin it is possible to improve the developing properties of the photosensitive resin composition and help reduce outgas.

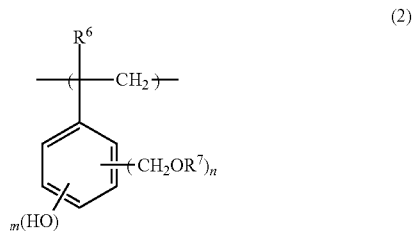

In formula (2), $R^6$ represents a hydrogen atom or an alkyl group of 1 to 5 carbon atoms, m represents an integer of 1 to 4, n represents an integer of 1 to 4, and m+n is in the range of 2 to 5. $R^7$ represents one or more selected from the group consisting of hydrogen and methyl, ethyl and propyl groups.

When a hydroxypolystyrene resin derivative is used as the binder resin (A) in the photosensitive resin composition of the invention, it is preferably a copolymer having a monomer unit represented by formula (2) and a monomer unit represented by formula (3), from the viewpoint of the alkali developing property and outgas.

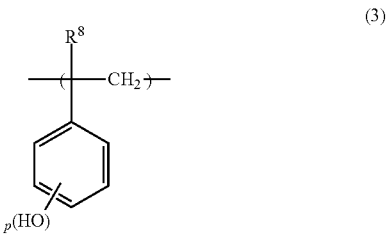

In formula (3), $R^8$ represents a hydrogen atom or an alkyl group of 1 to 5 carbon atoms, and p represents an integer of 1 to 5.

The monomer unit represented by formula (3) can be obtained, for example, by using a publicly known method to react formaldehyde with a portion of a polymer or copolymer obtained by using a publicly known method to polymerize one or more aromatic vinyl compounds having phenolic hydroxyl groups, such as p-hydroxystyrene, m-hydroxystyrene, o-hydroxystyrene, p-isopropenylphenol, m-isopropenylphenol and o-isopropenylphenol, and further reacting this with an alcohol.

The aromatic vinyl compound with a phenolic hydroxyl group is preferably p-hydroxystyrene or m-hydroxystyrene.

When the aforementioned hydroxypolystyrene resin derivative is used as the binder resin (A) in the photosensitive resin composition of the invention, the preferred number-average molecular weight is in the range of 1000 to 20,000, and more preferably in the range of 3000 to 10,000. If the molecular weight is 1000 or greater the alkaline solubility will be suitable as a photosensitive material resin, and if the molecular weight is no greater than 20,000 the coatability and developability will be satisfactory.

When the component (a1) also qualifies as the alkali-soluble resin (a2) with an epoxy group and a phenolic hydroxyl group, it is considered to be component (a1). When component (a2) also qualifies as another alkali-soluble resin (a3), it is considered to be component (a2). In other words, compounds qualifying as component (a1) are excluded for the alkali-soluble resin (a2) with an epoxy group and a phenolic hydroxyl group, and the other alkali-soluble resin (a3).

The binder resin (A) used may be a single type of resin alone, or a combination of two or more different resins may be used. When the binder resin (A) includes one or more selected from the group represented by component (a2) and component (a3) in addition to component (a1), the total amount of the one or more components selected from the group represented by component (a2) and component (a3) is preferably 1 to 100 parts by mass, more preferably 10 to 100 parts by mass and even more preferably 30 to 100 parts by mass, with respect to 100 parts by mass of the binder resin (A). When component (a2) and component (a3) are included within this range, the heat resistance of the photosensitive resin composition is satisfactory.

(B) Quinonediazide Adduct of Phenol Compound with 3 or More Phenolic Hydroxyl Groups (Trivalent or Greater Phenol Compound)

The photosensitive resin composition of the invention contains a quinonediazide adduct of a trivalent or greater phenol compound, as a radiation-sensitive compound. A "quinonediazide adduct" is, in the case of a trivalent phenol compound represented by formula (III), for example:

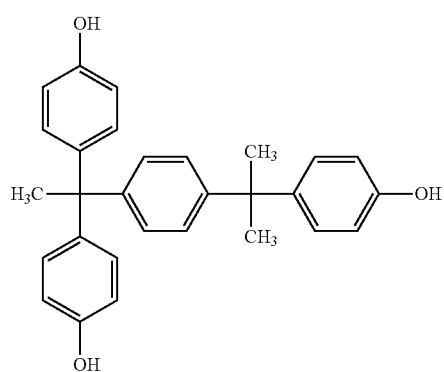

(III)

the following compound wherein at least one of the three phenolic hydroxyl groups of the phenol compound has been replaced by a group with a quinonediazide structure such as, for example, a naphthoquinonediazide sulfonate group (a hydroxyl group of the phenol compound is esterified (sulfonated) with a quinonediazide sulfonic acid halide).

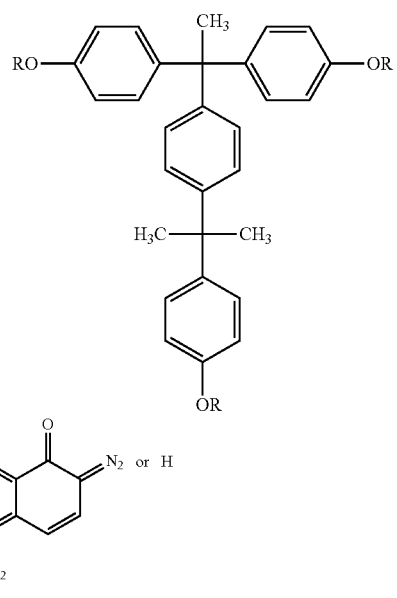

The quinonediazide adduct (B) (naphthoquinonediazide sulfonic acid ester) of the invention is known to produce a carboxyl group via the reaction represented by the following reaction formula (2), when exposed to ultraviolet rays or the like. Production of a carboxyl group causes the exposed portion (film) to be soluble in alkaline water, so that an alkali developing property is exhibited.

Reaction Formula 2

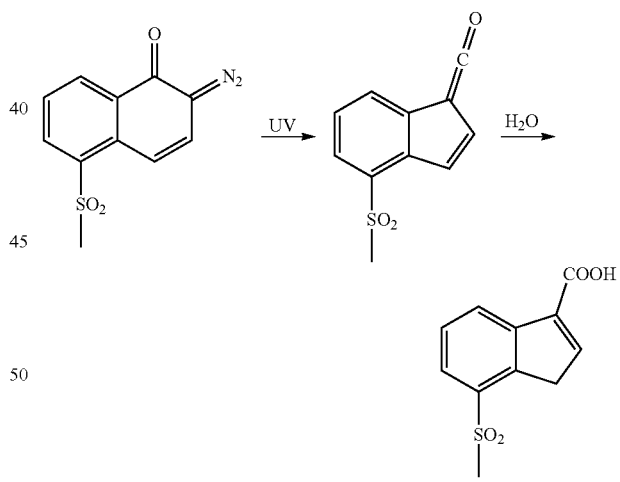

In the quinonediazide adduct (B) of a trivalent or greater phenol compound to be used for the invention, if (b1) represents a quinonediazide adduct wherein one of the hydroxyl groups of the phenolic hydroxyl groups of a trivalent or greater phenol compound are replaced by a structure represented by formula (I) or (II), and (b2) represents a quinonediazide adduct wherein two of the hydroxyl groups of the phenolic hydroxyl groups of a trivalent or greater phenol compound are replaced by structures represented by formula (I) or (II), then (b1) and (b2) in total may be included at 60 mol % or greater, preferably 65 mol % or greater and more preferably 70 mol % or greater, and no greater than 100 mol %, preferably no greater than 99 mol % and more preferably no greater than 98 mol %, of the entirety of (B).

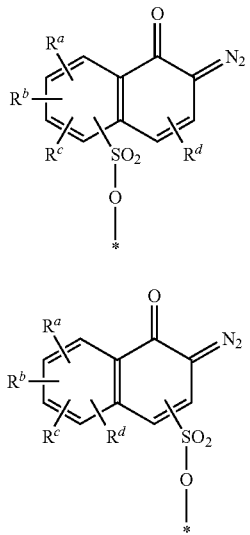

$R^a$ to $R^d$ each independently represent a hydrogen atom, an alkyl group of 1 to 10 carbon atoms or an alkoxy group of 1 to 10 carbon atoms, and the * symbol represents a bond with the aromatic ring of a trivalent or greater phenol compound.

The present inventors have found that if the radiation-sensitive compound used is a quinonediazide adduct (B) wherein (b1) and (b2) quinonediazide adducts are included in the proportions specified above, then it is possible to obtain a black photosensitive resin composition, and particularly a black positive-type photosensitive resin composition, that has high sensitivity even though it is black. The term "high sensitivity" here means that when a resist pattern formed using the photosensitive resin composition has been exposed to light at 150 mJ/cm², no problems arise in the resist pattern.

In order to increase the sensitivity of a photosensitive resin composition it is common to use a quinonediazide adduct having a maximally high proportion of photosensitive naphthoquinonediazide groups. For example, it is common to use a radiation-sensitive material with a high proportion of quinonediazide adducts mentioned above in which all of the three hydroxyl groups of the phenol compound are naphthoquinonediazide sulfonic acid esters. When using black photosensitive resin compositions, however, increase in sensitivity has not resulted even when such radiation-sensitive materials are used. This is believed to be because with a black photosensitive resin layer, exposure light is less able to penetrate from the surface layer to the lowermost layer, while the presence of a highly-photosensitive radiation-sensitive material such as mentioned above near the surface layer causes most of the exposure light to be absorbed (consumed), so that light of the necessary effective intensity for exposure does not reach to the interior of the black photosensitive resin layer. The quinonediazide adduct (B) used for the invention, however, includes at least 60 mol % of a quinonediazide adduct in which one or two phenolic hydroxyl groups of the trivalent or greater phenol compound are photosensitive naphthoquinonediazide sulfonic acid esters, i.e. one having lower photosensitivity than the highly photosensitive radiation-sensitive materials mentioned above. Presumably, therefore, with a black photosensitive resin layer including the quinonediazide adduct (B) according to the invention, the radiation-sensitive material with relatively low photosensitivity is evenly distributed in the layer, thus allowing exposure light to reach to the interior of the layer without being completely absorbed near the surface layer of the photosensitive resin layer, and thus allowing the entire black photosensitive resin layer to be efficiently exposed.

The trivalent or greater phenol compound has a molecular weight of preferably 250 or greater and more preferably 300 or greater, and although the upper limit for the molecular weight is not particularly restricted, it may be 1000 or lower, 800 or lower or 600 or lower. Such phenol compounds are preferred to be, but are not limited to, phenol compounds with 3 or more aromatic rings. These include, specifically, compounds represented by the following formulas (III) to (VI).

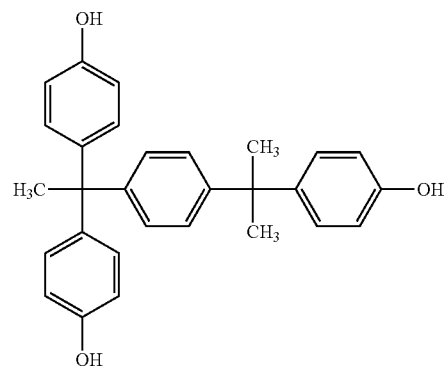

(Also referred to hereunder as "TS".),

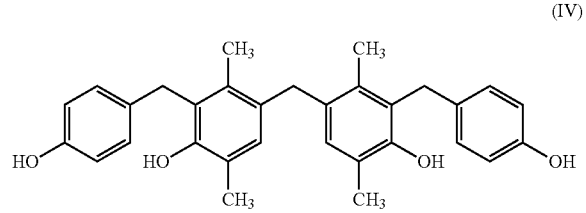 [SMILES: Cc1cc(Cc2cc(C)c(O)c(Cc3ccc(O)cc3)c2C)c(C)c(Cc2ccc(O)cc2)c1O]

(Also referred to hereunder as "CNB".),

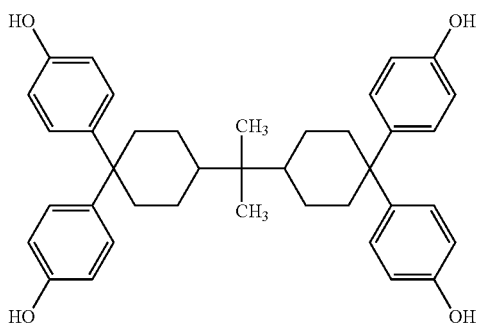

(Also referred to hereunder as "TEKP".),

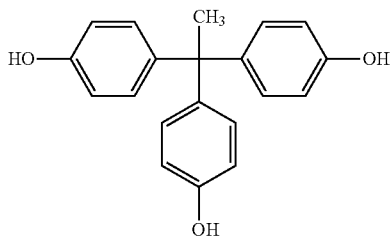

(Also referred to hereunder as "HP".)

A quinonediazide adduct (b1) or (b2) of a trivalent or greater phenol compound can be obtained by esterification reaction between a hydroxyl group of the trivalent or greater phenol compound and a compound represented by formula (Ia) or (IIa), for example,

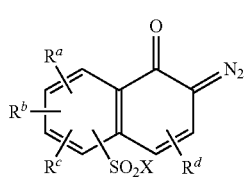

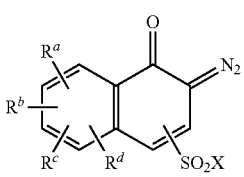

wherein $R^a$ to $R^d$ each independently represent a hydrogen atom, an alkyl group of 1 to 10 carbon atoms or an alkoxy group of 1 to 10 carbon atoms, and X represents a halogen atom or OH.

$R^a$ to $R^d$ each independently represent preferably a hydrogen atom or an alkyl or alkoxy group of 1 to 3 carbon atoms, more preferably a hydrogen atom or a methyl or methoxy group, and even more preferably a hydrogen atom. X is preferably chlorine. Specific examples include 1,2-naphthoquinonediazide-5-sulfonic acid chloride and 1,2-naphthoquinonediazide-4-sulfonic acid chloride. 1,2-Naphthoquinonediazide-5-sulfonic acid chloride is preferred.

The photosensitive resin composition of the invention may have a binder resin (A) content in the range of 100 to 1000 parts by mass, preferably 150 to 1000 parts by mass, more preferably 170 to 500 parts by mass and even more preferably 200 to 400 parts by mass, and a black coloring agent (C) content in the range of 15 to 750 parts by mass, preferably 30 to 350 parts by mass and more preferably 60 to 260 parts by mass, with respect to 100 parts by mass as the total amount of the quinonediazide adduct (B). The ratio (A/B) of the binder resin (A) and the quinonediazide adduct (B) is preferably 1.7 to 5.0 and more preferably 2.0 to 4.0, and the ratio (C/B) of the black coloring agent (C) and the quinonediazide adduct (B) is preferably 0.3 to 3.5 and more preferably 0.6 to 2.6. Within these ranges it will be possible to further improve the alkali developing property and sensitivity.

Black Coloring Agent (C)

The black coloring agent used for the invention may be a black dye (c1) specified by a color index (C.I.) of solvent black 27 to 47. The black dye is preferably defined by a C.I. of solvent black 27, 29 or 34. When at least one dye defined by a C.I. of solvent black 27 to 47 is used as the black dye, it is possible to obtain an optical density (OD) of 0.1 to 3.0 per 1 μm thickness of the film of the photosensitive resin composition after firing, and to maintain a more black color. The optical density (OD) per 1 μm thickness of the film is measurable using a transmission densitometer and a film thickness meter. When a photosensitive resin composition of the invention is used as a barrier rib material in a display device such as an organic EL display, this advantage allows the visibility of the display device to be increased.

The content of the black dye (c1) in the photosensitive resin composition of the invention is preferably 0.1 to 50 mass % and more preferably 5 to 40 mass %, with 100 mass % as the total of the binder resin (A), the quinonediazide compound (B), the black dye (C) and the remaining solid content (excluding the black dye). If its content is 0.1 mass % or greater it will be possible to obtain an OD value in the range of 0.1 to 3.0 per 1 μm thickness of the cured film after firing, and to maintain black color even after heating. If it is 50 mass % or lower, the film residue rate, heat resistance and sensitivity will be satisfactory.

The black pigment (c2) may also be used as the black coloring agent of the invention. Examples of black pigments include black pigments such as carbon black, carbon nanotubes, acetylene black, graphite, iron black, aniline black and titanium black. These may be used alone, or they may be used in combinations of two or more. The black pigment may also be used in the form of a dispersion. Preferred black pigments are titanium black and carbon black, with titanium black being more preferred.

The titanium black to be used for the invention may be one produced by a method of heating and reducing a mixture of titanium dioxide and titanium metal in a reducing atmosphere (Japanese Unexamined Patent Publication SHO No. 49-5432), a method of reducing ultrafine titanium dioxide, obtained by high-temperature hydrolysis of titanium tetrachloride, in a hydrogen-containing reducing atmosphere (Japanese Unexamined Patent Publication SHO No. 57-205322), a method of high-temperature reduction of titanium dioxide or titanium hydroxide in the presence of ammonia (Japanese Unexamined Patent Publication SHO No. 60-65069, Japanese Unexamined Patent Publication SHO No. 61-201610), or a method of accreting a vanadium compound onto titanium dioxide or titanium hydroxide and conducting high-temperature reduction in the presence of ammonia (Japanese Unexamined Patent Publication SHO No. 61-201610), without any particular limitation to these methods. Examples of commercially available titanium black products include titanium black 10S, 12S, 13R, 13M, 13M-C, 13-MT, 16M and UF-8 by Mitsubishi Materials Corporation, and Tilack D by Ako Kasei Co., Ltd. These titanium blacks may be used alone, or two or more may be used in combination.

The titanium black content is preferably 3 to 30 parts by mass, more preferably 5 to 20 parts by mass and even more preferably 8 to 15 parts by mass, based on 100 parts by mass of binder resin (A). The desired OD (optical density) value can be obtained if the titanium black content is 3 to 30 parts by mass based on 100 parts by mass of binder resin (A).

The mean particle diameter D50 of the titanium black in the dispersion (by volume) is preferably 5 to 100 nm. If the mean particle diameter D50 is 5 to 100 nm, a high light-shielding property can be obtained. The mean particle diameter D50 is measurable using a laser diffraction/scattering particle size distribution measuring instrument Microtrac wave (Nikkiso Co., Ltd.).

Since the heat resistance is particularly superior when a black dye specified by a color index (C.I.) of solvent black 27 to 47, and titanium black are employed as the black coloring agent, a photosensitive resin composition containing the black coloring agent can maintain black color and a high light-shielding property even after high-temperature treatment at 200° C. or higher.

(Optional Components)

As optional components, a dispersing agent, another coloring agent, a thermosetting agent, a surfactant, a solvent or the like may also be added to the photosensitive resin composition of the invention. Optional components are defined as any not corresponding to components (A) to (C).

(D) Dispersing Agent

A dispersing agent may also be used to disperse the pigment, such as titanium black. Publicly known dispersing agents may be used, examples of which include phosphoric acid dispersing agents such as phosphoric acid esters, polyphosphoric acid esters, phosphoric acid polyesters and polyether phosphoric acid esters, including the trade names DISPERBYK-110 and DISPERBYK-111 (Byk-Chemie, Japan), the trade name DISPARLON® PW-36, DISPARLON® DA-375 (Kusumoto Chemicals, Ltd.), carboxyl group-containing polymer dispersing agents such as the trade names FLOWLEN G-700, FLOWLEN G-900 and FLOWLEN GW-1500 (Kyoeisha Chemical Co., Ltd.), and higher fatty acid ester dispersing agents such as the trade names AJISPER® PN411 and AJISPER® PA 111 (Ajinomoto Fine-Techno Co. Inc.). Of these it is preferred to use dispersing agents without graft chains on the backbone, such as the trade names DISPERBYK-110 and DISPERBYK-111 (Byk-Chemie, Japan).

The dispersing agent is included at preferably 1 to 40 parts by mass, more preferably 2 to 30 parts by mass and even more preferably 3 to 20 parts by mass, with respect to 100 parts by mass of the black pigment (c2). If the dispersing agent content is 1 to 40 parts by mass with respect to 100 parts by mass of the black pigment (c2) it will be possible to satisfactorily disperse the particles.

(E) Other Coloring Agents

The photosensitive resin composition of the invention may contain other coloring agents as additional optional components. Such coloring agents include dyes, organic pigments and inorganic pigments, which may be used according to the purpose.

Specific examples of dyes include azo dyes, benzoquinone dyes, naphthoquinone dyes, anthraquinone dyes, cyanine dyes, squarylium dyes, croconium dyes, merocyanine dyes, stilbene dyes, diphenylmethane dyes, triphenylmethane dyes, fluorane dyes, spiropyran dyes, phthalocyanine dyes, indigo dyes, fulgide dyes, nickel complex dyes and azulene dyes.

Pigments include C.I. Pigment Yellow 20, 24, 86, 93, 109, 110, 117, 125, 137, 138, 147, 148, 153, 154 and 166, C.I. Pigment Orange 36, 43, 51, 55, 59 and 61, C.I. Pigment Red 9, 97, 122, 123, 149, 168, 177, 180, 192, 215, 216, 217, 220, 223, 224, 226, 227, 228 and 240, C.I. Pigment Violet 19, 23, 29, 30, 37, 40 and 50, C.I. Pigment Blue 15, 15:1, 15:4, 22, 60 and 64, C.I. Pigment Green 7 and C.I. Pigment Brown 23, 25 and 26.

(F) Thermosetting Agent

A thermosetting agent is preferably added to the photosensitive resin composition of the invention to allow the composition to be cured by heating. A thermal radical generator may be used as the thermosetting agent. Preferred thermal radical generators include organic peroxides, and specifically organic peroxides with 10-hour half-life temperatures of 100 to 170° C., such as dicumyl peroxide, 2,5-dimethyl-2,5-di(tert-butylperoxy)hexane, tert-butylcumyl peroxide, di-tert-butyl peroxide, 1,1,3,3-tetramethylbutyl hydroperoxide and cumene hydroperoxide.

The preferred content of the thermosetting agent is 0.1 to 5 parts by mass and more preferably 0.5 to 3 parts by mass, based on 100 parts by mass as the total of the binder resin (A), the quinonediazide compound (B), the black coloring agent (C) and the remaining solid content (excluding the thermosetting agent).

(G) Surfactant

The photosensitive resin composition of the invention may preferably contain a surfactant as an additional optional component, to improve the coatability or to improve the coating film developability, for example. Examples of such surfactants include nonionic surfactants, including polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; and polyoxyethylene dialkyl esters such as polyoxyethylene dilaurate and polyoxyethylene distearate; fluorine-based surfactants such as MEGAFACE® F-251, F-281, F-430, F-444, R-40, F-553, F-554, F-555, F-556, F-557, F-558 and F-559 (all trade names of DIC Corp.), and SURFLON® S-242, S-243, S-420 and S-611 (all trade names of AGC Seimi Chemical Co., Ltd.); and the organosiloxane polymers KP323, KP326 and KP341 (all trade names of Shin-Etsu Chemical Co., Ltd.). These may be used alone, or two or more may be used together.

Such surfactants are added in amounts of preferably no greater than 2 parts by mass and more preferably no greater than 1 part by mass, based on 100 parts by mass as the total of the binder resin (A), quinonediazide compound (B), black coloring agent (C) and the remaining solid content (excluding the surfactant).

(H) Solvent

The photosensitive resin composition of the invention is preferably dissolved in a solvent for use as a solution, from the viewpoint of coatability onto a substrate. For example, the binder resin may be dissolved in a solvent, and then the quinonediazide compound and black coloring agent, and additives such as a thermosetting agent and surfactant if necessary, may be mixed with the solution in their prescribed proportions to prepare a photosensitive resin composition in a solution state. A suitable solid concentration may be employed depending on the purpose of use, and for example, the solid concentration may be 1 to 60 mass %, preferably 3 to 50 mass % and more preferably 5 to 40 mass %.

Examples of solvents to be used include glycol ethers such as ethyleneglycol monomethyl ether, ethyleneglycol dimethyl ether, ethyleneglycol methyl ethyl ether and ethyleneglycol monoethyl ether, ethyleneglycol alkyl ether acetates such as methylcellosolve acetate and ethylcellosolve acetate, diethyleneglycols such as diethyleneglycol monomethyl ether, diethyleneglycol diethyl ether, diethyleneglycol dimethyl ether, diethyleneglycol ethyl methyl ether, diethyleneglycol monoethyl ether and diethyleneglycol monobutyl ether, propyleneglycol alkyl ether acetates such as propyleneglycol methyl ether acetate and propyleneglycol ethyl ether acetate, aromatic hydrocarbons such as toluene and xylene, ketones such as methyl ethyl ketone, methyl amyl ketone, cyclohexanone, 4-hydroxy-4-methyl-2-pentanone and cyclohexanone, esters such as ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanoate, methyl 3-methoxypropionate, ethyl 3-methoxypropionate, methyl 3-ethoxypropionate, ethyl 3-ethoxypropionate, ethyl acetate, butyl acetate, methyl lactate, ethyl lactate and γ-butyrolactone, and amides such as N-methyl-2-pyrrolidone, N,N-dimethylformamide and N,N-dimethylacetamide. These solvents may be used alone, or they may be used in combinations of two or more.

[Method for Preparing Photosensitive Resin Composition]

The photosensitive resin composition of the invention can be prepared by dissolving or dispersing the binder resin (A), the quinonediazide compound (B), the black coloring agent (C) and other components if necessary, in a solvent, and mixing them. A suitable solid concentration may be employed depending on the purpose of use, and the solid concentration may be 10 to 60 mass %, for example. The prepared composition solution is usually filtered before use. The filtration means may be a membrane filter with a pore size of 0.05 to 1.0 μm, for example. The photosensitive resin composition of the invention prepared in this manner also has excellent storage stability for prolonged periods.

[Method for Producing Pigment Dispersion]

When a pigment is to be mixed, preferably the pigment is dispersed in the solvent before mixing the binder resin (A) and quinonediazide compound (B). The pigment dispersion can be produced by mixing the pigment, solvent, and a dispersing agent if necessary. The disperser used for cracking and dispersion of the pigment is not particularly restricted and may be a ball type such as a ball mill, sand mill, bead mill, paint shaker or rocking mill, a blade type such as a kneader, paddle mixer, planetary mixer or Henschel mixer, or a roll type such as a triple roll mixer, or alternatively it may be a crusher (raikai mixer), colloid mill, ultrasonic waves, homogenizer or rotating/revolving mixer. Preferred among these is a ball type, which allows stable microdispersion in a short period of time. The material of the ball used in a ball type may be glass, silicon nitride, alumina, zircon, zirconia, steel or the like. It is possible to use common shapes with diameters of 0.03 to 25 mm, but small diameters of 5 mm or smaller are preferred from the viewpoint of micronization.

There are no particular restrictions on the order of addition for preparation of the dispersion, but the following order is preferred in order to obtain a satisfactory dispersion.

First, the solvent and dispersing agent are uniformly dispersed. By uniformly dispersing the solvent and dispersing agent beforehand it is possible to inhibit problems such as aggregation of particles due to the occurrence of an area having a partially high dispersing agent concentration. The necessary amount of pigment is then added to the prepared solution, and finally the beads are added. Preliminary dispersion may also be carried out if aggregation is observed in the pigment. A binder resin or other resin components may also be used, for the purpose of compatibility with the resin and inhibiting reaggregation of the pigment.

There are no particular restrictions on the order of mixing the pigment dispersion, the binder resin, the quinonediazide compound, and the optional components, and for example, the binder resin may be dissolved in a solvent, and then the quinonediazide compound and pigment dispersion, and additives such as a thermosetting agent and surfactant if necessary, may be mixed with the solution in their prescribed proportions to prepare a photosensitive resin composition in a solution state.

The stirrer used for mixing of the pigment dispersion, binder resin, quinonediazide compound and optional components is not particularly restricted and may be a ball type such as a ball mill, sand mill, bead mill, paint shaker or rocking mill, a blade type such as a kneader, paddle mixer, planetary mixer or Henschel mixer, or a roll type such as a triple roll mixer, or alternatively it may be a crusher (raikai mixer), a colloid mill, ultrasonic waves, a homogenizer, a rotating/revolving mixer or a mechanical stirrer. It is preferably used with a labo-level because this will allow the mechanical stirrer to mix stably in a short period of time. The stirring blade used for stirring may be selected as appropriate from among fan, propeller, cross, turbine and dragonfly types. The pigment dispersion and binder resin solution may be mixed and stirred at 10 to 1000 rpm at room temperature for 1 to 10 minutes, to obtain a resin composition. The prepared composition solution is preferably filtered before use. The filtration means may be a membrane filter with a pore size of 0.05 to 1.0 μm, for example. The photosensitive resin composition of the invention prepared in this manner also has excellent storage stability for prolonged periods.

[Pattern Formation and Curing Method]

When the photosensitive resin composition of the invention is to be used for positive-type radiation lithography, for example, first the photosensitive resin composition of the invention dissolved in a solvent may be coated onto a substrate surface and removed the solvent by means such as heating, to form a coated film. The method for coating the photosensitive resin composition onto the substrate surface is not particularly restricted, and any of various methods such as spraying, roll coating, slit methods or spin coating methods may be used.

After the photosensitive resin composition of the invention dissolved in a solvent has been coated onto a substrate surface, it will usually be heated (pre-baked) to remove the solvent and form the coated film. The heating conditions will differ depending on the types and mixing proportions of the different components, but usually the coated film can be obtained by heat treatment at 70 to 130° C. for a prescribed period of time, such as 1 to 20 minutes on a hot plate, or 3 to 60 minutes in an oven.

The pre-baked coated film is then exposed to radiation (for example, visible light rays, ultraviolet rays or far ultraviolet rays) through a mask having a prescribed pattern (exposure step) and developed with a developing solution in order to remove the unwanted portions and form a coated film with the prescribed pattern (developing step). When a naphthoquinonediazide sulfonic acid ester is used as the photosensitive compound, the preferred radiation is ultraviolet rays to visible light rays with a wavelength of 250 to 450 nm.

Examples of developing solutions include aqueous solutions of alkalis which may be inorganic alkalis such as sodium hydroxide, potassium hydroxide, sodium carbonate, sodium silicate, sodium metasilicate and ammonia water; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide and choline; or cyclic amines such as pyrrole, piperidine, 1,8-diazabicyclo[5.4.0]-7-undecene and 1,5-diazabicyclo [4.3.0]-5-nonane. The concentration is not particularly restricted but is preferably 0.5 to 5.0 mass %. An aqueous solution comprising appropriate amounts of a water-soluble organic solvent such as methanol or ethanol and a surfactant added to the aforementioned aqueous alkali solution may be used as the developing solution. The developing time will usually be 30 to 180 seconds, and the developing method may be puddle development, shower development, dipping development or a similar method. Following development, flow rinsing is carried out for 30 to 90 seconds to remove the unwanted portions, and air-drying is carried out with compressed air or compressed nitrogen, thereby forming a pattern. The pattern may then be heat treated for 20 to 200 minutes at a prescribed temperature such as 120 to 350° C. using a heating apparatus such as a hot plate or oven to obtain the coated film, optionally with stepwise increase in the temperature (heat treatment step).

The present invention may employ a method for producing a radiation lithography structure, that includes (1) a coating step in which the photosensitive resin composition mentioned above is dissolved in a solvent and coated onto a substrate, (2) a drying step in which the solvent in the coated photosensitive resin composition is removed, (3) an exposure step in which radiation is irradiated through a photomask, (4) a developing step in which a pattern is formed by alkali development, and (5) a heat treatment step in which heating is carried out at a temperature of 100 to 350° C. The method may be used to form an organic EL element barrier rib or an insulating film, for example.

According to the invention it is possible to obtain an organic EL element barrier rib comprising the cured photosensitive resin composition.

According to the invention it is also possible to obtain an organic EL element insulating film comprising the cured photosensitive resin composition.

According to the invention it is also possible to obtain an organic EL element that includes the cured photosensitive resin composition.

EXAMPLES

The present invention will now be explained in greater detail using examples and comparative examples, with the understanding that the invention is not limited to the examples.

(1) Synthesis of Binder Resin

[Production Example 1] Production of Alkali-Soluble Copolymer of Polymerizable Monomer with Alkali-Soluble Functional Group and Another Polymerizable Monomer (Component a1-1)

In 180 g of 1-methoxy-2-propyl acetate (Dicel) there were completely dissolved 76.8 g of 4-hydroxyphenyl methacrylate ("PQMA" by Showa Denko K.K.), 28.8 g of N-cyclohexylmaleimide (Nippon Shokubai Co., Ltd.), 1.80 g of V-601 (Wako Pure Chemical Industries, Ltd.) as a polymerization initiator and 1.92 g of S-dodecyl-S'-(α,α'-dimethyl-α"-acetic acid) trithiocarbonate ("723010" by Sigma-Aldrich Japan, KK.) as a RAFT agent. In a 500 mL three-necked flask, the obtained solution was added dropwise over a period of 2 hours to 180 g of 1-methoxy-2-propyl acetate (Dicel) that had been heated to 85° C. under a nitrogen gas atmosphere, and reaction was then conducted at 85° C. for 3 hours. After cooling to room temperature, the reaction solution was added dropwise into 1200 g of toluene and a polymer was precipitated. The precipitated polymer was recovered by filtration and vacuum dried at 80° C. for 15 hours, and 104.4 g of a faint yellow powder was collected. This was dissolved in γ-butyrolactone to obtain a resin solution with a solid content of 20 mass % (resin solution a1-1). The number-average molecular weight of the obtained reaction product was 12,400, and the weight-average molecular weight was 21,100.

[Production Example 2] Production of Alkali-Soluble Copolymer of Polymerizable Monomer with Alkali-Soluble Functional Group and Another Polymerizable Monomer (Component a1-2)

In 240 g of 1-methoxy-2-propyl acetate (Dicel) there were completely dissolved 102.4 g of 4-hydroxyphenyl methacrylate ("PQMA" by Showa Denko K.K.), 38.4 g of N-cyclohexylmaleimide (Nippon Shokubai Co., Ltd.), 3.54 g of V-601 (Wako Pure Chemical Industries, Ltd.) as a polymerization initiator and 7.58 g of S-dodecyl-S'-(α,α'-dimethyl-α"-acetic acid) trithiocarbonate ("723010" by Sigma-Aldrich Japan, KK.) as a RAFT agent. In a 500 mL three-necked flask, the obtained solution was added dropwise over a period of 2 hours to 240 g of 1-methoxy-2-propyl acetate (Dicel) that had been heated to 85° C. under a nitrogen gas atmosphere, and reaction was then conducted at 85° C. for 3 hours. After cooling to room temperature, the reaction solution was added dropwise into 1800 g of toluene and a polymer was precipitated. The precipitated polymer was recovered by filtration and vacuum dried at 80° C. for 15 hours, and 129.7 g of a faint yellow powder was collected. This was dissolved in γ-butyrolactone to obtain a resin solution with a solid content of 20 mass % (resin solution a1-2). The number-average molecular weight of the obtained reaction product was 7500, and the weight-average molecular weight was 11,300.

[Production Example 3] Production of Alkali-Soluble Copolymer of Polymerizable Monomer with Alkali-Soluble Functional Group and Another Polymerizable Monomer (Component a1-3)

In 108 g of 1-methoxy-2-propyl acetate (Dicel) there were completely dissolved 33.0 g of 4-hydroxyphenyl methacrylate ("PQMA" by Showa Denko K.K.), 9.29 g of N-cyclohexylmaleimide (Nippon Shokubai Co., Ltd.) and 4.31 g of V-601 (Wako Pure Chemical Industries, Ltd.) as a polymerization initiator. In a 500 mL three-necked flask, the obtained solution was added dropwise over a period of 2 hours to 72.0 g of 1-methoxy-2-propyl acetate (Dicel) that had been heated to 85° C. under a nitrogen gas atmosphere, and reaction was then conducted at 85° C. for 5 hours. After cooling to room temperature, the reaction solution was added dropwise into 960 g of toluene and a polymer was precipitated. The precipitated polymer was recovered by filtration and vacuum dried at 90° C. for 9 hours, and 37.8 g of a white powder was collected. This was dissolved in γ-butyrolactone to obtain a resin solution with a solid content of 20 mass % (resin solution a1-3). The number-average molecular weight of the obtained reaction product was 7400, and the weight-average molecular weight was 14,100.

[Production Example 4] Production of Alkali-Soluble Resin with Epoxy Group and Phenolic Hydroxyl Group (Component a2-1)

After charging 60 g of γ-butyrolactone (Mitsubishi Chemical Corp.) as a solvent and 42 g of EPICLON® N-695 (DIC Corp., cresol-novolak-type epoxy resin, epoxy equivalents: 210) as a compound having at least two epoxy groups per molecule into a 300 mL three-necked flask, the mixture was dissolved under a nitrogen gas atmosphere at 60° C. There were further added 15.5 g of 3,5-dihydroxybenzoic acid (Wako Pure Chemical Industries, Ltd.) as a hydroxybenzoic acid (0.10 mol, 0.5 equivalent with respect to 1 epoxy equivalent) and 0.2 g (0.76 mmol) of triphenylphosphine (Hokko Chemical Industry Co., Ltd.) as a reaction catalyst, and reaction was conducted at 110° C. for 12 hours. The reaction solution was returned to room temperature and diluted with γ-butyrolactone to a solid content of 20 mass %, and the solution was filtered to recover 260 g (resin solution a2-1). The number-average molecular weight of the obtained reaction product was 2400, and the weight-average molecular weight was 5600.

[Production Example 5] Production of Alkali-Soluble Resin with Epoxy Group and Phenolic Hydroxyl Group (Component a2-2)

Resin solution a2-2 was obtained by the same method as Production Example 4, except that 21.7 g of 3,5-dihydroxybenzoic acid (Wako Pure Chemical Industries, Ltd.) (0.14 mol, 0.7 equivalent with respect to 1 epoxy equivalent) was used, and reaction was conducted at 110° C. for 24 hours. The number-average molecular weight of the obtained reaction product was 3200, and the weight-average molecular weight was 9000.

[Production Example 6] Production of Alkali-Soluble Resin with Epoxy Group and Phenolic Hydroxyl Group (Component a2-3)

Resin solution a2-3 was obtained by the same method as Production Example 4, except that 37.6 g of EPICLON® N-770 (DIC Corp., cresol-novolak-type epoxy resin, epoxy equivalents: 188), as a compound with at least two epoxy groups per molecule, and 20.1 g of 3,5-dihydroxybenzoic acid (HighChem Co., Ltd.) (0.13 mol, 0.65 equivalent with respect to 1 epoxy equivalent) were used, and reaction was conducted at 110° C. for 24 hours. The number-average molecular weight of the obtained reaction product was 2400, and the weight-average molecular weight was 8300.

The number-average molecular weight and weight-average molecular weight were calculated using a calibration curve prepared using a polystyrene standard substance, under the following measuring conditions.
Apparatus: Shodex® GPC-101
Column: Shodex® LF-804
Mobile phase: Tetrahydrofuran
Flow rate: 1.0 mL/min
Detector: Shodex® RI-71
Temperature: 40° C.

(2) Starting Materials (A) Binder Resin

The binder resin (A) used was resin solution x1, prepared by adjusting the resin solutions a1-1 to a1-3 and a2-1 to a2-3 synthesized in Production Examples 1 to 6, and the novolak-phenol resin BRG-558 (Aica SDK Phenol Co., Ltd.), to a solid content of 20 mass % with γ-butyrolactone.

The materials in addition to the binder resin (A) are listed in Table 1. Table 2 shows the proportion of naphthoquinonediazidesulfone sulfonate groups (DNQ) replacing phenolic hydroxyl groups of the trivalent or greater phenol compound in the quinonediazide adduct (B). In Table 1 and Table 2, "B1" indicates compounds wherein one of the phenolic hydroxyl groups of the phenol compound is substituted by DNQ, "B2" indicates those wherein two are substituted by DNQ, "B3" indicates those wherein three are substituted by DNQ, and "B0" indicates no substitution.

TABLE 1

| | Product name | Manufacturer | Description |
|---|---|---|---|
| Quinonediazide adduct (B) | TS-100G | Toyo Gosei Co., Ltd. | γ-Butyrolactone solution of 1,2-naphthoquinonediazide-5-sulfonic acid ester of α,α,α-tris(4-hydroxyphenyl)-1-ethyl-4-isopropylbenzene (solid content 20 mass %) |
| | HP-190 | Toyo Gosei Co., Ltd. | 1,2-Naphthoquinonediazide-5-sulfonic acid ester of 1,1,1-tris(4-hydroxyphenyl)ethane |
| | NT-150 | Toyo Gosei Co., Ltd. | 1,2-Naphthoquinonediazide-5-sulfonic acid ester of 2,3,4-trihydroxybenzophenone |
| | CNB-150 | Toyo Gosei Co., Ltd. | Ester of bis[3-(4-hydroxybenzyl)-4-hydroxy-2,5-dimethylphenyl]methane and 6-diazo-5,6-dihydro-5-oxonaphthalene-1-sulfonic acid |
| | TS-150 | Toyo Gosei Co., Ltd. | γ-Butyrolactone solution of 1,2-naphthoquinonediazide-5-sulfonic acid ester of α,α,α-tris(4-hydroxyphenyl)-1-ethyl-4-isopropylbenzene (solid content 20 mass %) |
| | TEKP-150 | Toyo Gosei Co., Ltd. | 1,2-Naphthoquinonediazide-5-sulfonic acid ester of 4,4'-{(propane-2,2-diyl)bis[1-(4-hydroxyphenyl)cyclohexane-1,4-diyl]}diphenol |
| | TS-200 | Toyo Gosei Co., Ltd. | 1,2-Naphthoquinonediazide-5-sulfonic acid ester of α,α,α-tris(4-hydroxyphenyl)-1-ethyl-4-isopropylbenzene |
| | TS-300 | Toyo Gosei Co., Ltd. | 1,2-Naphthoquinonediazide-5-sulfonic acid ester of α,α,α-tris(4-hydroxyphenyl)-1-ethyl-4-isopropylbenzene (B0 + B1: 0 mol %, B2: 1 mol %, B3: 99 mol %) |

TABLE 1-continued

| | Product name | Manufacturer | Description |
|---|---|---|---|
| Black coloring agent (C) | VALIFAST (R) BLACK 3804 | Orient Chemical Industries, Co., Ltd. | Black dye specified by C.I. of Solvent black 34 |
| | VALIFAST (R) BLACK 3810 | Orient Chemical Industries, Co., Ltd. | Black dye specified by C.I. of Solvent black 29 |
| | VALIFAST (R) BLACK 3820 | Orient Chemical Industries, Co., Ltd. | Black dye specified by C.I. of Solvent black 27 |
| (D) Solvent | γ-butyrolactone | Mitsubishi Chemical Corp. | |
| (E) Optional component | SURFLON (R) S-386 | AGC Seimi Chemical Co., Ltd. | Perfluoroalkyl compound |
| | MEGAFACE (R) F-559 | DIC Corp. | Perfluoroalkyl compound |
| | TPPA-R (TS) | Toyo Gosei Co., Ltd. | α,α,α-tris(4-hydroxyphenyl)-1-ethyl-4-isopropylbenzene (B0: 100 mol %) |

TABLE 2

| Quinonediazide adduct (B) | Proportion of B1 (mol %) | Proportion of B2 (mol %) | Total proportion of B1 and B2 (mol %) |
|---|---|---|---|
| TS-100G | 42 | 41 | 83 |
| HP-190 | 17 | 48 | 65 |
| NT-150 | 24 | 38 | 62 |
| CNB-150 | 51 | 43 | 94 |
| TS-150 | 26 | 46 | 72 |
| TEKP-150 | 26 | 42 | 68 |
| TS-200 | 13 | 42 | 55 |
| TS-300 | 0 | 1 | 1 |
| TPPA-R | 0 | 0 | 0 |

(3) Preparation and Evaluation of Positive-Type Photosensitive Resin Composition

Example 1

After mixing and dissolving 20 g of resin solution a2-2 (4 g solid content), 5.0 g of resin solution a1-1 (1.0 g solid content), 9.0 g of resin solution a1-2 (1.8 g solid content) and 1.0 g of resin solution x1 (0.2 g solid content), there were added 15 g of TS-100G as a quinonediazide compound, 4.3 g of VALIFAST® BLACK 3804 as a black coloring agent and 0.022 g of SURFLON® S-386 as a surfactant, and further mixing was carried out. After visually confirming dissolution, the solution was filtered with a membrane filter having a pore size of 0.22 µm, to prepare a positive-type photosensitive resin composition with a solid concentration of 12 mass %.

Examples 2 to 8 and Comparative Examples 1 to 4

Positive-type photosensitive resin compositions were prepared by the same method as Example 1, except that the compositions were as listed in Table 3. The numerical unit for each component in the Examples listed in Table 3 is "g", with the parentheses indicating the amount of solid content (g).

The positive-type photosensitive resin compositions prepared in the Examples and Comparative Examples were evaluated for alkali developing property, pattern formability and OD (optical density) value. The results are shown in Table 3. The evaluating methods were as follows.

[Alkali Developing Property and Pattern Formability]

Glass substrates (size: 100 mm×100 mm×0.7 mm) were bar coated with the positive-type photosensitive resin compositions of Examples 1 to 8 and Comparative Examples 1 to 4, respectively, to a dry film thickness of 1.8 to 2 µm, and the solvent was dried off at 120° C. for 80 seconds. Each one was then exposed to 100 mJ/cm$^2$ through a quartz photomask, using an exposure device equipped with an ultrahigh voltage mercury lamp (trade name MULTILIGHT ML-251A/B by Ushio Inc.). The exposure dose was measured using a UV integrated light meter (trade name UIT-150, photodetector UVD-S365 by Ushio Inc.). The exposed coated film was subjected to alkali development with a 2.38 mass % tetramethylammonium hydroxide aqueous solution for 60 seconds using a spin developer (AD-1200 by Takizawa Sangyo K.K.), and the alkali developing property was evaluated. Based on observation with an optical microscope (VH-Z250 by Keyence Corp.), an assessment of "Good" was assigned when no residue was found after alkali development, and an assessment of "Poor" was assigned when a residue was found.

The pattern formability was evaluated by line width measurement of the pattern after alkali development. An optical microscope (VH-Z250 by Keyence Corp.) was used to confirm the locations where the line widths in the line and space pattern of a photomask were each 10 m. For evaluation of the pattern formability, "Good" was assigned when the line widths of the line and space pattern after alkali development were 1:1, "Fair" was assigned when the line widths of the line portions were within ±10% and not "Good", and "Poor" was assigned for all other cases. Those assigned an alkali developing property evaluation of "Poor" are indicated as "not assessable" in the pattern formability row.

[Od Value]

Glass substrates (size: 100 mm×100 mm×0.7 mm) were coated with the positive-type photosensitive resin compositions of Examples 1 to 8 and Comparative Examples 1 to 4, respectively, to approximately 1.3 µm, and then heated on a hot plate at 120° C. for 80 seconds to dry off the solvent. They were then cured at 250° C. under a nitrogen gas atmosphere for 60 minutes to obtain coated films. The cured coated films were measured with a transmission densitometer (BMT-1 by Sakata Inx Eng. Co., Ltd.), and the values were converted to OD values per 1 µm. The thickness of each coated film was measured using an optical film thickness meter (F-20NIR by Filmetrics Japan, Inc.).

TABLE 3

| | | | | Example 1 | Example 2 | Example 3 | Example 4 | Example 5 | Example 6 |
|---|---|---|---|---|---|---|---|---|---|
| Content (g) | Binder resin (A) | Component a1 | Resin solution a1-1 | 5.0 (1.0) | — | — | 20 (4.0) | — | — |
| | | | Resin solution a1-2 | 9.0 (1.8) | 39 (7.8) | — | — | — | — |
| | | | Resin solution a1-3 | — | — | 21.5 (4.3) | — | 14 (2.8) | 13 (2.6) |
| | | Component a2 | Resin solution a2-1 | — | — | 15 (3.0) | — | — | — |
| | | | Resin solution a2-2 | 20 (4.0) | 39 (7.8) | — | 19 (3.8) | 20 (4.0) | — |
| | | | Resin solution a2-3 | — | — | — | — | — | 12.5 (2.5) |
| | | Components other than a1 and a2 | Resin solution x1 | 1.0 (0.2) | 1.0 (0.2) | 1.0 (0.2) | — | 1.0 (0.2) | — |
| | Quinonediazide adduct (B) | | TS-100G | 15 | — | — | — | 15 | — |
| | | | HP-190 | — | 2.0 | — | — | — | — |
| | | | NT-150 | — | — | 2.5 | — | — | — |
| | | | CNB-150 | — | — | — | 2.2 | — | — |
| | | | TS-150 | — | — | — | — | — | 1.9 |
| | | | TEKP-150 | — | — | — | — | — | — |
| | | | TS-200 | — | — | — | — | — | — |
| | | | TS-300 | — | — | — | — | — | — |
| | Unsubstituted trivalent phenol compound (TS) | | TPPA-R | — | — | — | — | — | — |
| | Black coloring agent (C) | | VALIFAST BLACK 3804 | 4.3 | — | 4.3 | 4.4 | 4.3 | 3.0 |
| | | | VALIFAST BLACK 3810 | — | 3.9 | — | — | — | — |
| | | | VALIFAST BLACK 3820 | — | — | — | — | — | — |
| | (E) Additive | Surfactant | SURFLON S-386 | 0.022 | 0.022 | 0.022 | 0.022 | 0.022 | — |
| | | | MEGAFACE F-559 | — | — | — | — | — | 0.022 |

| | | | | Example 7 | Example 8 | Comp. Example 1 | Comp. Example 2 | Comp. Example 3 | Comp. Example 4 |
|---|---|---|---|---|---|---|---|---|---|
| Content (g) | Binder resin (A) | Component a1 | Resin solution a1-1 | — | — | 5.0 (1.0) | 5.0 (1.0) | 5.0 (1.0) | 5.0 (1.0) |
| | | | Resin solution a1-2 | — | — | 9.0 (1.8) | 9.0 (1.8) | 9.0 (1.8) | 9.0 (1.8) |
| | | | Resin solution a1-3 | 12.5 (2.5) | 13.5 (2.7) | — | — | — | — |
| | | Component a2 | Resin solution a2-1 | — | — | — | — | — | — |
| | | | Resin solution a2-2 | — | — | 20 (4.0) | 20 (4.0) | 20 (4.0) | 20 (4.0) |
| | | | Resin solution a2-3 | 12.5 (2.5) | 12.5 (2.5) | — | — | — | — |
| | | Components other than a1 and a2 | Resin solution x1 | — | — | 1.0 (0.2) | 1.0 (0.2) | 1.0 (0.2) | 1.0 (0.2) |
| | Quinonediazide adduct (B) | | TS-100G | — | — | — | — | — | — |
| | | | HP-190 | — | — | — | — | — | — |
| | | | NT-150 | — | — | — | — | — | — |
| | | | CNB-150 | — | — | — | — | — | — |
| | | | TS-150 | 1.9 | — | — | — | — | — |
| | | | TEKP-150 | — | 1.4 | — | — | — | — |
| | | | TS-200 | — | — | 3.0 | 2.0 | 1.5 | — |
| | | | TS-300 | — | — | — | — | — | 3.0 |
| | Unsubstituted trivalent phenol compound (TS) | | TPPA-R | — | — | 1.0 | 1.5 | — | — |
| | Black coloring agent (C) | | VALIFAST BLACK 3804 | — | — | 4.3 | 4.3 | 4.3 | 4.3 |
| | | | VALIFAST BLACK 3810 | — | — | — | — | — | — |
| | | | VALIFAST BLACK 3820 | 3.1 | 3.4 | — | — | — | — |
| | (E) Additive | Surfactant | SURFLON S-386 | — | — | 0.022 | 0.022 | 0.022 | 0.022 |
| | | | MEGAFACE F-559 | 0.022 | 0.022 | — | — | — | — |

TABLE 3-continued

|  |  |  | Example 1 | Example 2 | Example 3 | Example 4 | Example 5 | Example 6 |
|---|---|---|---|---|---|---|---|---|
| Compositional ratio (parts by mass) | Binder resin (A) | Component a1 | 28 | 78 | 43 | 40 | 28 | 26 |
|  |  | Component a2 | 40 | 78 | 30 | 38 | 40 | 25 |
|  |  | Components other than a1 and a2 | 2 | 2 | 2 | 0 | 2 | 0 |
|  | Quinonediazide adduct (B) | Content | 30 | 20 | 25 | 22 | 30 | 19 |
|  |  | Total proportion of B1 and B2 (mol %) | 83 | 65 | 62 | 90 | 83 | 72 |
|  | (C) Black dye |  | 43 | 39 | 43 | 44 | 43 | 30 |
|  | (D) Solvent |  | 1050 | 1050 | 1050 | 1050 | 1050 | 1050 |
|  | (E) Additive (surfactant) |  | 0.22 | 0.22 | 0.22 | 0.22 | 0.22 | 0.22 |
| Binder resin (A) with respect to 100 parts by mass quinonediazide adduct (B) |  |  | 233 | 400 | 300 | 355 | 233 | 268 |
| Black coloring agent (C) with respect to 100 parts by mass quinonediazide adduct (B) |  |  | 143 | 195 | 172 | 200 | 143 | 158 |
| Results | Alkali developing property |  | Good | Good | Good | Good | Good | Good |
|  | Pattern formability |  | Good | Good | Fair | Good | Good | Good |
|  | OD value |  | 1.0 | 1.0 | 1.0 | 1.0 | 1.0 | 1.0 |

|  |  |  | Example 7 | Example 8 | Comp. Example 1 | Comp. Example 2 | Comp. Example 3 | Comp. Example 4 |
|---|---|---|---|---|---|---|---|---|
| Compositional ratio (parts by mass) | Binder resin (A) | Component a1 | 25 | 27 | 28 | 28 | 28 | 28 |
|  |  | Component a2 | 25 | 25 | 40 | 40 | 40 | 40 |
|  |  | Components other than a1 and a2 | 0 | 0 | 2 | 2 | 2 | 2 |
|  | Quinonediazide adduct (B) | Content | 19 | 14 | 30 | 30 | 30 | 30 |
|  |  | Total proportion of B1 and B2 (mol %) | 72 | 68 | 55 | 55 | 55 | 2 |
|  | (C) Black dye |  | 31 | 34 | 43 | 43 | 43 | 43 |
|  | (D) Solvent |  | 1050 | 1050 | 1050 | 1050 | 1050 | 1050 |
|  | (E) Additive (surfactant) |  | 0.22 | 0.22 | 0.22 | 0.22 | 0.22 | 0.22 |
| Binder resin (A) with respect to 100 parts by mass quinonediazide adduct (B) |  |  | 263 | 371 | 233 | 233 | 233 | 233 |
| Black coloring agent (C) with respect to 100 parts by mass quinonediazide adduct (B) |  |  | 163 | 242 | 143 | 143 | 143 | 143 |
| Results | Alkali developing property |  | Good | Good | Poor | Poor | Totally dissolved | Poor |
|  | Pattern formability |  | Good | Good | Not assessable | Not assessable | — | Not assessable |
|  | OD value |  | 1.0 | 1.1 | 1.0 | 1.0 | 1.0 | 1.0 |

The results shown in Table 3 show that all of the properties including the alkali developing property, pattern formability and OD value were in an excellent balance with Examples 1 to 8 which used the prepared photosensitive resin compositions. In each of the Examples, a satisfactory light-shielding property (OD value) was obtained while satisfactory results were also obtained for the alkali developing property and pattern formability, as indexes of sensitivity. In Comparative Examples 1 to 4, however, which used photosensitive resin compositions containing quinonediazide adducts with total proportion of B1 and B2 of less than 60 mol %, the light-shielding property was excellent but the coated films could not be adequately exposed with a light quantity of 100 mJ/cm$^2$, and therefore satisfactory results were not obtained for the alkali developing property and pattern formability.

INDUSTRIAL APPLICABILITY

The black photosensitive resin composition of the invention has high sensitivity and can therefore be suitably utilized in positive-type radiation lithography, for example. An organic EL element comprising a barrier rib and insulating film formed from the black photosensitive resin composition of the invention can be suitably used as an electronic component in a display device that exhibits satisfactory contrast.

The invention claimed is:

1. A photosensitive resin composition including:

(A) a binder resin, (B) a quinonediazide adduct of a phenol compound having 3 or more phenolic hydroxyl groups (hereunder also referred to as "trivalent or greater phenol compound", and (C) a black coloring agent, wherein:

the quinonediazide adduct (B) includes:

(b1) a quinonediazide adduct wherein one of the hydroxyl groups of the phenolic hydroxyl groups of the trivalent or greater phenol compound is replaced by a structure represented by formula (I) or (II), and (b2) a quinonediazide adduct wherein two of the hydroxyl groups of the phenolic hydroxyl groups of the trivalent or greater phenol compound are replaced by structures represented by formula (I) or (II), and the total of (b1) and (b2) is at least 60 mol % of the entirety of (B),

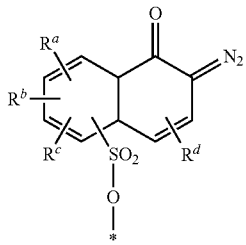

(I)

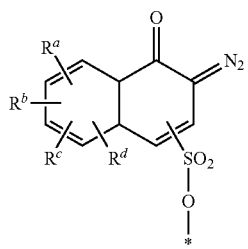

(II)

wherein $R^a$ to $R^d$ each independently represent a hydrogen atom, an alkyl group of 1 to 10 carbon atoms or an alkoxy group of 1 to 10 carbon atoms, and the * symbol represents a bond with the aromatic ring of a trivalent or greater phenol compound.

2. The photosensitive resin composition according to claim 1, wherein the trivalent or greater phenol compound has 3 or more aromatic rings.

3. The photosensitive resin composition according to claim 1, wherein the trivalent or greater phenol compound is at least one selected from among compounds represented by the following formulas (III) to (VI):

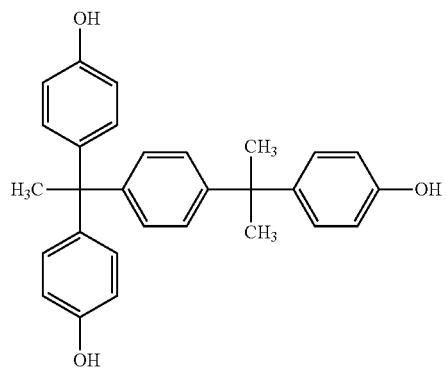

(III)

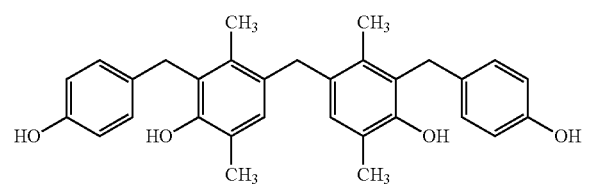

(IV)

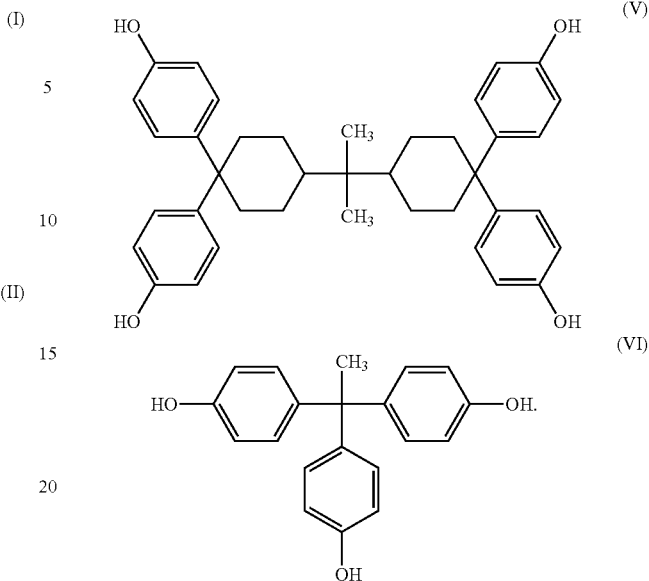

4. The photosensitive resin composition according to claim 1, wherein the content of the binder resin (A) is 100 to 1000 parts by mass and the content of the black coloring agent (C) is 15 to 750 parts by mass, with respect to 100 parts by mass as the total amount of the quinonediazide adduct (B).

5. The photosensitive resin composition according to claim 1,
wherein the binder resin (A) contains at least one selected from the group consisting of (a1) alkali-soluble copolymers of a polymerizable monomer having an alkali-soluble functional group, and another polymerizable monomer, and (a2) alkali-soluble resins having an epoxy group and a phenolic hydroxyl group.

6. The photosensitive resin composition according to claim 1, wherein:
the black coloring agent (C) includes at least one selected from the group consisting of:
(c1) black dyes specified by a color index of solvent black 27 to 47, and
(c2) titanium black.

7. An organic EL element insulating film comprising a cured product of the photosensitive resin composition according to claim 1.

8. An organic EL element barrier rib comprising a cured product of the photosensitive resin composition according to claim 1.

9. An organic EL element that includes a cured product of the photosensitive resin composition according to claim 1.

10. A method for producing a radiation lithography structure, the method including:
(1) a coating step in which a photosensitive resin composition according to claim 1 is dissolved in a solvent and coated onto a substrate,
(2) a drying step in which the solvent in the coated photosensitive resin composition is removed,
(3) an exposure step in which radiation is irradiated through a photomask,
(4) a developing step in which a pattern is formed by alkali development, and
(5) a heat treatment step in which heating is carried out at a temperature of 100 to 350° C.

11. The photosensitive resin composition according to claim 1,
wherein the binder resin (A) contains at least one selected from the group consisting of acrylic resins, styrene resins, epoxy resins, amide resins, phenol resins and polyamic acid resins.

* * * * *